(12) United States Patent
Ayers, Sr.

(10) Patent No.: US 7,032,146 B2
(45) Date of Patent: Apr. 18, 2006

(54) BOUNDARY SCAN APPARATUS AND INTERCONNECT TEST METHOD

(75) Inventor: Robert Lee Ayers, Sr., Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 423 days.

(21) Appl. No.: 10/282,825

(22) Filed: Oct. 29, 2002

(65) Prior Publication Data

US 2004/0083413 A1    Apr. 29, 2004

(51) Int. Cl.
 *G01R 31/28* (2006.01)
(52) U.S. Cl. .............. 714/727; 714/724; 714/726; 714/718
(58) Field of Classification Search ........... 714/724, 714/726, 736, 718, 731, 734, 814
See application file for complete search history.

(56) References Cited

U.S. PATENT DOCUMENTS

| | | | |
|---|---|---|---|
| 4,016,431 A | 4/1977 | Henle et al. ............ 307/208 |
| 4,780,874 A | 10/1988 | Lenoski et al. ............ 371/25 |
| 4,875,003 A * | 10/1989 | Burke ..................... 714/736 |
| 5,127,008 A * | 6/1992 | Bassett et al. ........... 714/726 |
| 5,150,366 A | 9/1992 | Bardell, Jr. et al. ..... 371/22.3 |
| 5,528,601 A | 6/1996 | Schmookler ............ 371/22.3 |
| 5,615,217 A | 3/1997 | Horne et al. ............ 371/22.3 |
| 5,631,912 A | 5/1997 | Mote, Jr. ................ 371/22.3 |
| 5,867,507 A * | 2/1999 | Beebe et al. ............. 714/726 |
| 5,917,729 A | 6/1999 | Naganuma et al. ....... 364/491 |
| 6,125,464 A | 9/2000 | Jin ........................ 714/727 |
| 6,195,775 B1 | 2/2001 | Douskey et al. ......... 714/727 |
| 6,591,388 B1 * | 7/2003 | Vonreyn .................. 714/726 |
| 6,694,463 B1 * | 2/2004 | Hui et al. ................ 714/724 |

OTHER PUBLICATIONS

IBM, LSSD Scan Path Truncated To Minimum Length for Testing; IBM Technical Disclosure Bulletin, May 1983, US; vol. # 25; p. # 6547-6549.*

IBM Technical Disclosure Bulletin. vol. 33. No. 8. Jan. 1991. pp. 82-86. "Chip Interconnect Delay Test and Sort Technique".

* cited by examiner

*Primary Examiner*—Guy Lamarre
*Assistant Examiner*—Fritz Alphonse
(74) *Attorney, Agent, or Firm*—Josh G. Cockburn; Dillon & Yudell LLP

(57) ABSTRACT

An electronic device, such as chip, card, system and in situ boundary scan test facilities are disclosed. The boundary scan test facility includes a boundary scan cell (Level Sensitive Scan Design, LSSD structure and selector) connected between output pads of the electronic device. By so doing the test path for boundary scan testing is segregated from the operational signal path which is used when the device is performing its normal function.

17 Claims, 6 Drawing Sheets

BOUNDARY SCAN APPARATUS AND INTERCONNECT TEST METHOD

BACKGROUND OF THE INVENTION

1) Field of the Invention

The present invention relates to test methodology in general and in particular to structures and methodologies used in boundary scan to test the connectivity of interconnected devices.

2) Prior Art

Boundary scan testing to detect defects in the connectivity of connected devices are well known in the prior art. IEEE 1149.1 standard also called JTAG set forth the popular and well known prior art technique for boundary scan testing. The JTAG structure requires an on chip controller (state machine). The on chip controller uses silicon real estate (space), a scarce commodity in semiconductor integrated circuit technology.

FIG. 1 shows a prior art chip 100 configured according to JTAG standard. The prior art chip consists of internal circuits 102 connected to JTAG boundary scan cells 104, I/O drivers/receivers 106 and I/O pads 108. As can be seen from the FIG. 1 each one of the boundary scan cells 104 (JTAG structure) is placed in series with its associated driver/receiver circuit. Stated another way each of the boundary scan cells is placed between its associated I/O driver/receiver and the internal logic. By so doing the signal path used by the chip during normal operation and the test signal path coalesce.

Even though the JTAG structure and test methodology works well for their intended purposes they include features which make them undesirable. As pointed out above, the JTAG structures are placed within the normal signal patch of the chip resulting in a finite timing delay. This is undesirable in that it slows down the speed of the chip. As pointed out above the on chip controller required by JTAG structures is another negative. Still another drawback is that JTAG structure and methodology has limited testing capabilities. It cannot test certain types of differential and analog I/Os.

In view of the above there is a need for a structure and methodology for boundary scan testing that solves problems and shortcomings identified with prior art JTAG or IEEE 1149.1 standard or other conventional Boundary Scan testing methodology. This need is met by the structure and methodology of the present invention set forth and described hereinafter.

SUMMARY OF THE INVENTION

It is one object of the present invention to provide a boundary scan test facility that requires fewer devices than prior art boundary scan test circuits.

It is another object of the present invention to provide a boundary scan test facility that uses less space (silicon real estate) than was heretofore been possible in the prior art.

The present invention describes a boundary scan test facility and methodology including an LSSD structure and connected selector placed between I/O pads of a chip. By so doing the test path and signal path (used by chip during normal operation) are separate, thereby eliminating the finite delay and other problems associated with JTAG and other conventional boundary scan methodology. The invention provides the following benefits:

A. Conventional boundary scan cell delay path eliminated.
B. Boundary scan Drive/Receive not limited to functional driver/receiver. Pseudo driver can be programmed (enabled) on any I/O pad.
C. LSSD timing flexibility allows launch/capture between devices to test for AC defects.
D. Silicon real estate is conserved by the design not requiring an on chip controller.

DETAILED DESCRIPTION OF THE ILLUSTRATED EMBODIMENT

Figure 2:
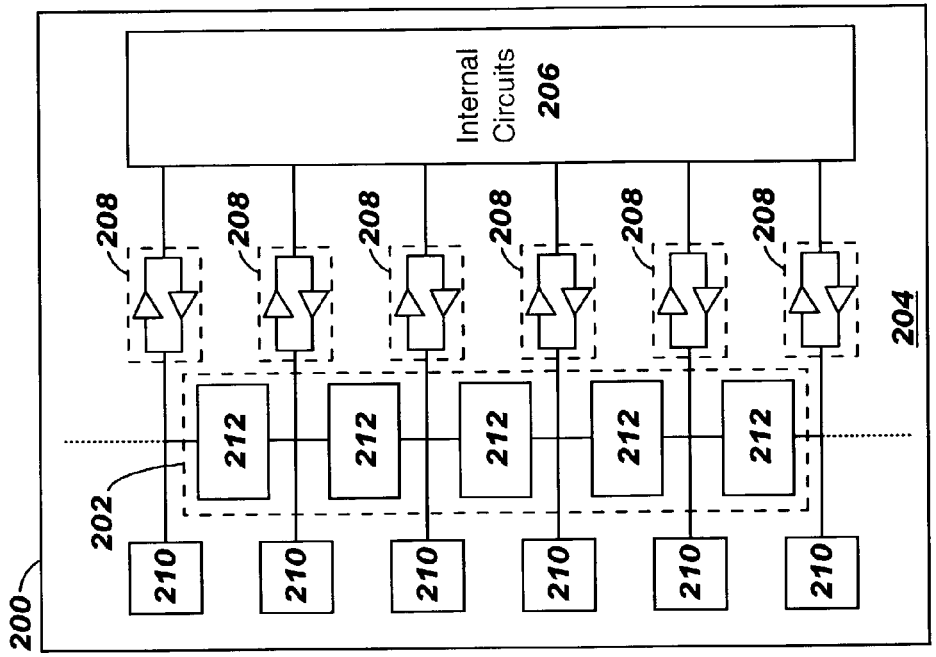
FIG. 2 shows a boundary scan configuration according to teachings of the present invention.

FIG. 2 shows a schematic of VLSI (Very Large Scale Integrated) chip or module 200 and boundary scan testing facility 202, including boundary scan cells 212, according to the teachings of the present invention. The VLSI chip 200 includes a substrate 204 on which internal circuits 206 are fabricated. The internal circuits 206 may take any form and are interconnected to provide the function which the chip is designed to provide. For example, if the chip is a network processor the internal circuits 206 would be generated and configured to provide the function provided by the network processor chip such as PowerNP™, a family of network processors developed and marketed by IBM. It should be noted that the internal circuits can be so designed to provide any function which one desires. In addition to being a network processor the chip could be a PLA or any other types of chips. The VLSI chip 200 is further characterized by a plurality of driver/receiver circuits 208 connecting the internal circuits 206 to individual I/O pads 210. The structure and use of driver/receiver circuit 208 are well known in the prior art. Therefore, details of the circuit 208 will not be given. Suffice it to say that each of the driver/receiver 208 is in the functional signal path of the chip and is used to send/receive information during normal operation of the chip. In normal operation the signal path between the chip and I/O pads is through the functional driver/receiver 208. The boundary scan testing facility 202 is wired or connected between the I/O pads of the VLSI chip. By wiring the boundary scan testing facility 202 between the I/O pads of the VLSI chip a separate signal path is provided for testing of the chip. When compared with FIG. 1 of the prior art it is clear that because the testing facilities are not in the path of normal signal operation there is no delay added as is done in the conventional boundary scan facility shown in FIG. 1.

Figure 1:
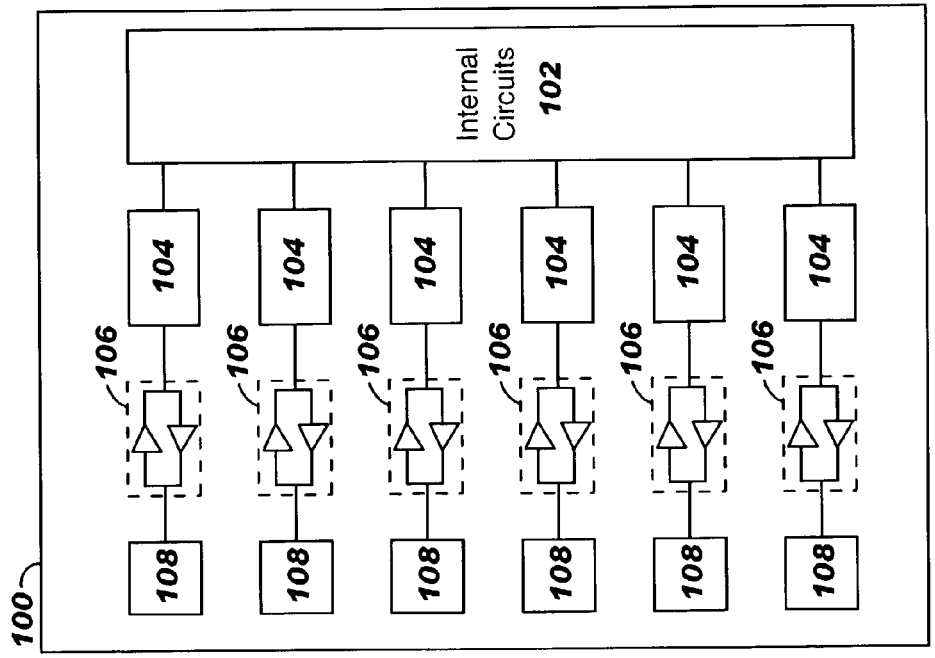
FIG. 1 shows a prior art configuration of a conventional boundary scan arrangement.
Figure 3:
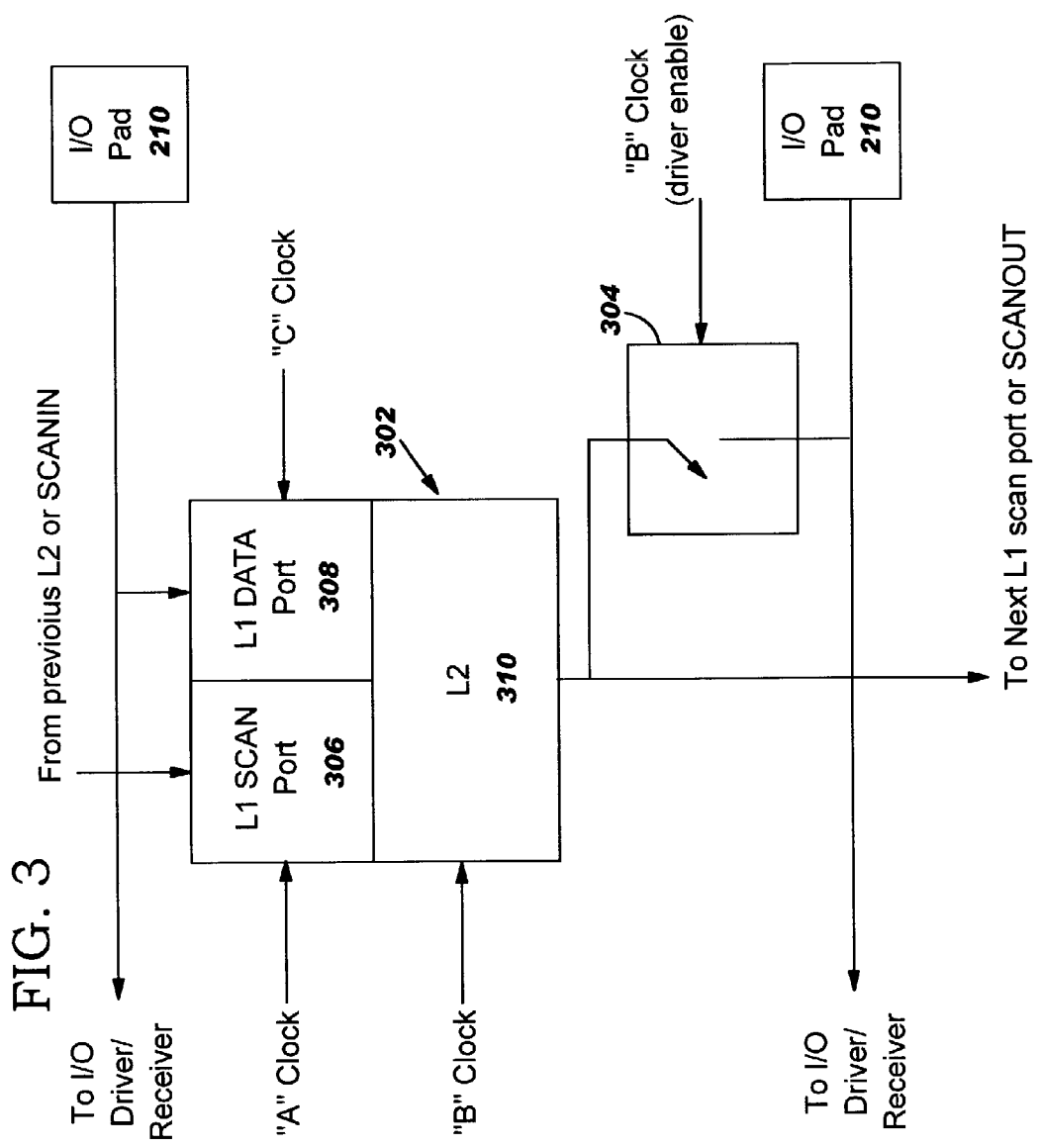
FIG. 3 shows a block diagram of test facilities, including boundary scan cell, according to teachings of the present invention.

FIG. 3 shows a block diagram of the boundary scan cell 212 interconnected between I/O pads 210 according to the teachings of the present invention. The structure of the boundary scan cells 212 are identical for each; therefore, the showing in FIG. 3 is intended to cover all the boundary scan cells shown in FIG. 2. The boundary scan cell 212 includes an LSSD structure 302 connected to switch driver 304 and LSSD clocking structure to clock the LSSD structure 302 and the switch driver 304. The signal lines entering and leaving the cell are labeled with appropriate identifiers that are self-explanatory and will not be described further. The LSSD structure 302 includes latch 1 (L1) scan port 306, latch 1 (L1) data port 308 and latch 2 (L2) 310 operatively coupled to the ports 306 and 308. Ports 306 receives the scan in while port 308 receives data. The LSSD structure 302 and connected switch driver 304 function as a driver/receiver for scan signal depending on the setting of the switch in driver 304. If the switch in driver 304 is closed then the combination function as a driver forwarding signal to the directly connected I/O pads 210. If the switch in driver 304 is open the LSSD structure 302 functions as a receiver with signals flowing in the direction shown by the respective arrows. The LSSD clocking structure includes the well known LSSD A clock, B clock and C clock. These clocks are used in their conventional LSSD manner and will not be discussed further. The LSSD L1/L2 latch with a selectable driver 304 wired between the chip's I/Os create a driver/receiver that is used for the interconnect test and has the well known LSSD A/B clock scan capability for interconnect test results and diagnostics. Since the latch is placed between I/Os, and not in the signal path between chip internal logic and I/O driver and receiver as shown in FIG. 1, no additional timing propagation delays are created. Instead of using the chip's functional I/O driver and receiver 208 (FIG. 2) the latches input and output in the boundary scan cells 212 (FIGS. 2 and 3) are used giving interconnect test capability to all digital I/Os and analog devices not presently possible.

In addition, with the LSSD clock structure, a timed "launch and capture" between devices is now possible to test for interconnect defects that result in timing delay faults. In addition, with the LSSD clock structure, test time can be reduced with the data path transition "flush". With the static nature of LSSD latch, input condition to non-boundary scan devices (like memory) can be held for testing of these devices.

Figure 4:
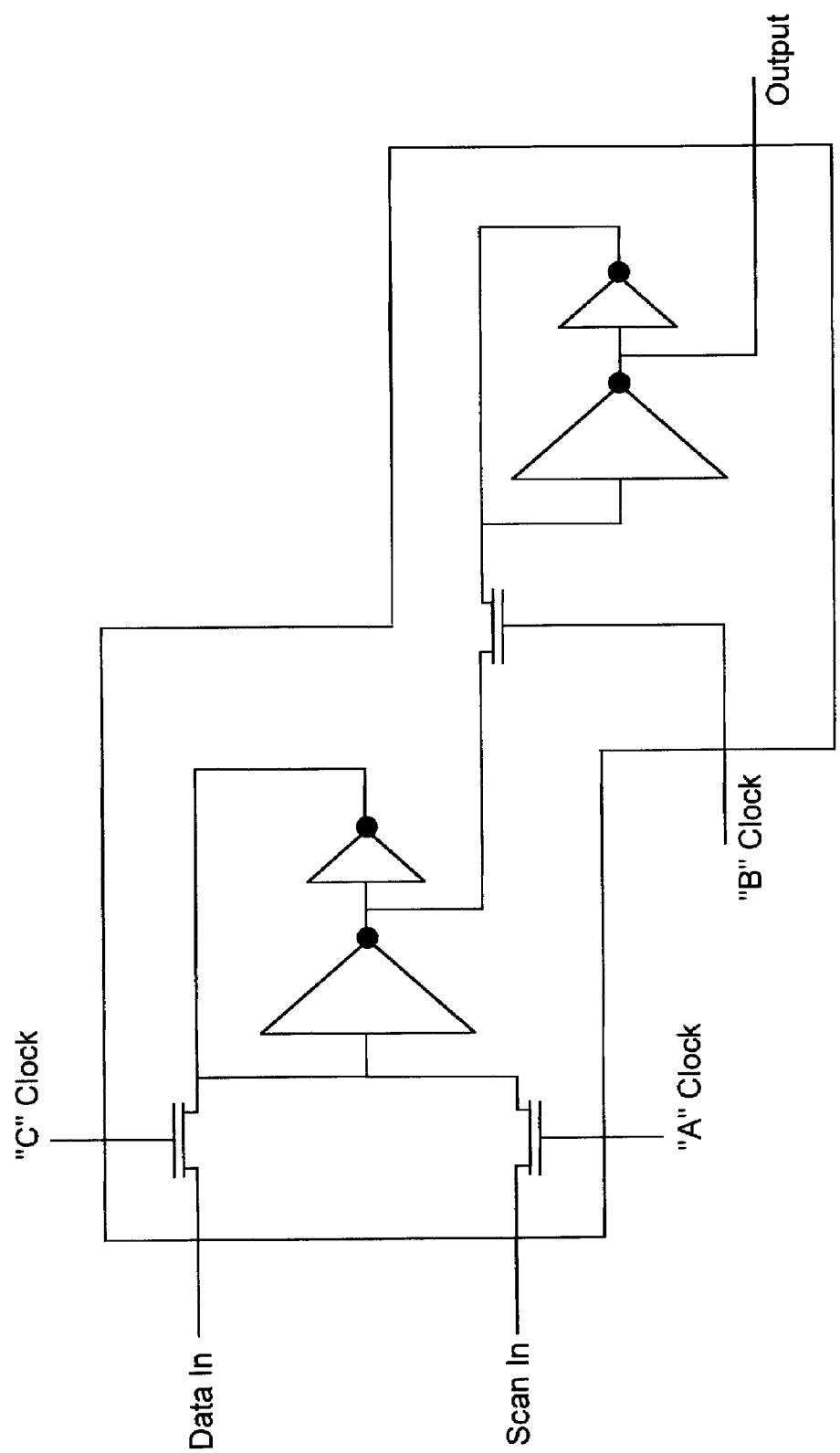
FIG. 4 shows a circuit diagram of the LSSD structure used in FIG. 3.

FIG. 4 shows a circuit diagram for the LSSD structure 302 (FIG. 4) and the LSSD clock structure. As discussed above the LSSD clock structure includes the well known LSSD A clock, B clock and C clock. The LSSD structure includes L1/L2 latch connected in series. The L1 latch includes inverters 402 and 404 connected in series with a feedback loop from inverter 404 to the input of inverter 402. The combination of inverters 402 and 404 form a latch. N channel FET device 406 and N channel FET device 408 form independent gating facilities into the latch. The C clock is applied to the gate of FET device 406 while the A clock is applied to the gate of FET device 408. Data In is applied to FET device 406 while Scan In is applied to FET device 408. The L2 latch includes inverter 410 connected in series to inverter 412 and the output 412 is fed back into 410 forming the L2 latch. N channel FET device 414 connects the output from L1 into L2. The gate of N channel FET device 414 is connected to the LSSD B clock. The operation of this LSSD structure is well known and further description will not be given.

Figure 5:
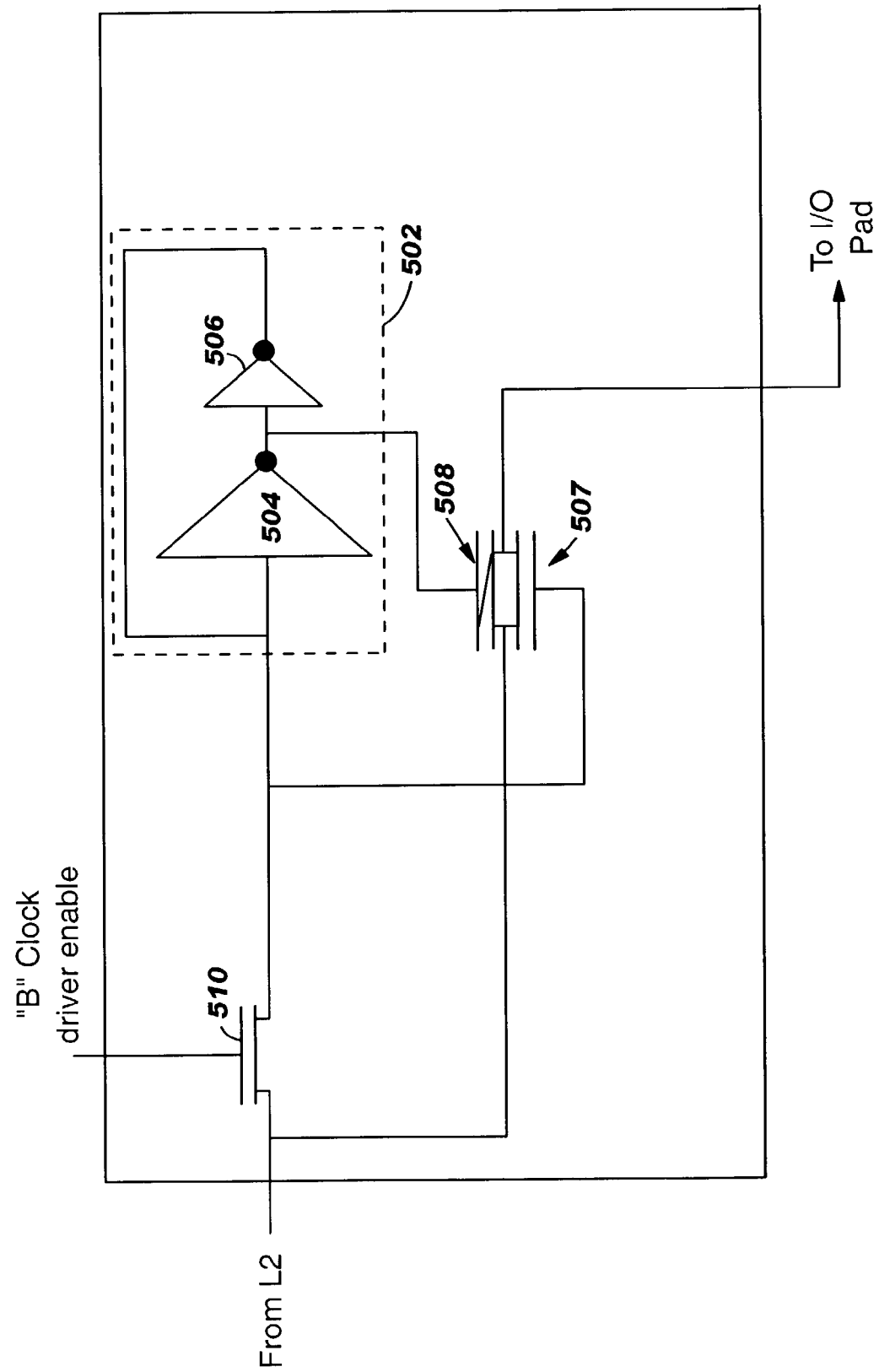
FIG. 5 shows a circuit diagram of the selector switch used in FIG. 3.

FIG. 5 shows one embodiment of a circuit for switch driver 304 (FIG. 3). The switch driver circuit includes a latch 502 formed by series connected inverters 504 and 506. The output from inverter 504 in latch 502 controls the gate formed by P channel FET device 508. Likewise, the output of inverter 506, in latch 502 controls the gate of N-channel FET 507. N-channel device 510 is also connected to P channel gate formed by P channel FET device 508. The gate of N channel FET device 510 is connected to the B clock while a signal from the L2 latch is fed into said N channel FET 510. In operation a logical "1" from L2 turns on transistors 507 and 508 while a "0" from L2 turns transistors 507 and 508 off. In particular a logical 1 must be present in the L2 latch, which gets loaded into the enabled latch 502. The output of inverter 504 in the latch drives the gate of P channel device 508. The output of inverter 506 drives the gate of N channel FET 507. N channel device 507 and P channel device 508 form a transfer gate with both conducting with a 1 loaded from L2 latch. With the "B" clock driver enable off the subsequent "0"s and "1"s from the L2 latch will be transferred to the I/O pad. To turn the driver off, a "0" is loaded into the enabled latch 502.

Figure 6:
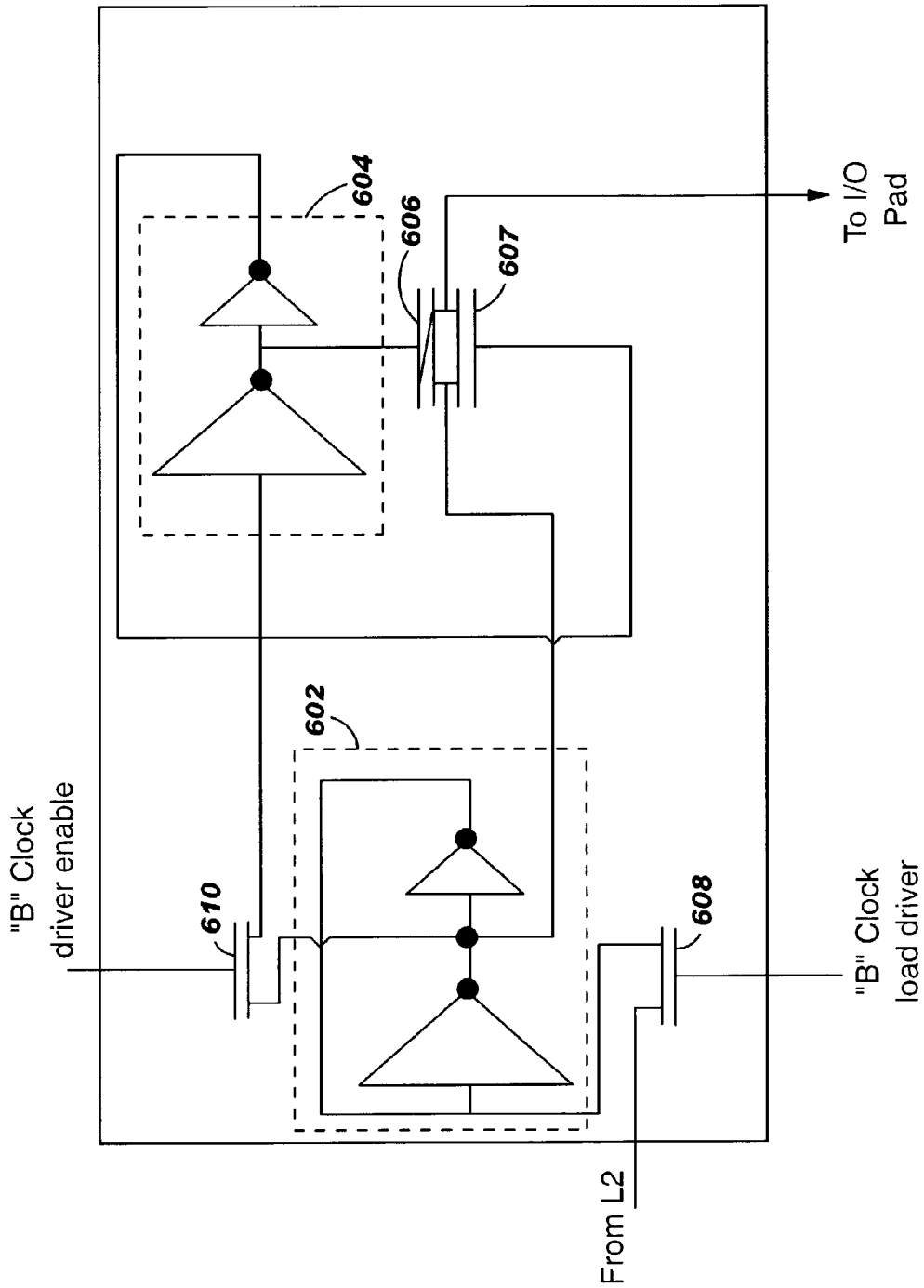
FIG. 6 shows an alternate embodiment of the selector switch used in FIG. 3.

FIG. 6 shows an alternate embodiment of a circuit for the switch driver 304 (FIG. 3). The alternate switch driver circuit includes latches 602 and 604. Each latch is identical and formed by two inverters interconnected in series. The latch structure has already been described above and will not be described further. A P channel FET device 606 and N-channel FET device 607 create a transfer gate between the output of latch 602 and the I/O pad. Likewise, N channel device 610 is used to load data into latch 604. With a "1" loaded into the input of latch 604, transistors 606 and 607 will be on. With a "0" loaded into latch 604, transistors 606 and 607 will be off. The data from boundary scan cell L2 will only be loaded into latch 602 with N-channel FET 608 active.

Figure 7:
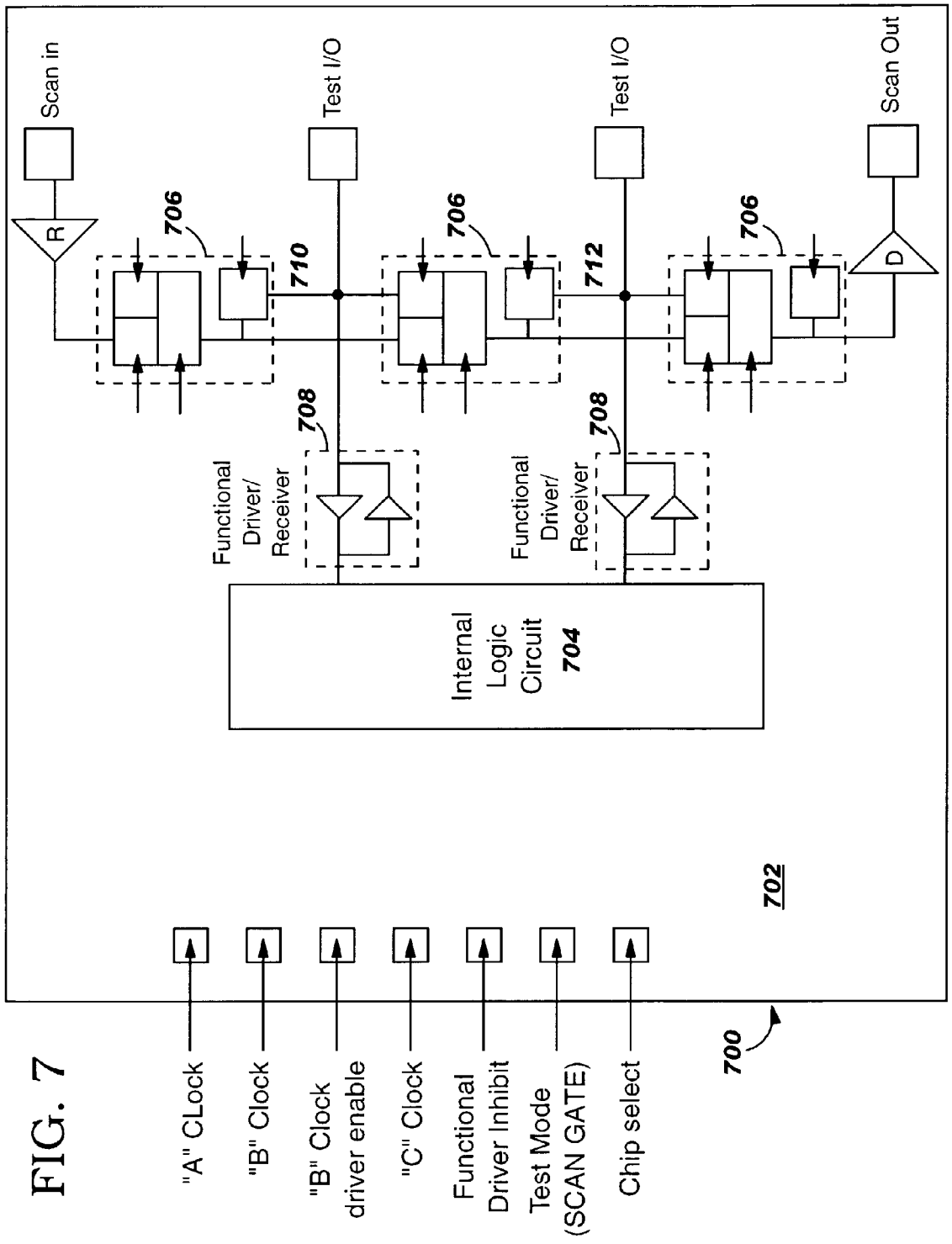
FIG. 7 shows a test configuration for a chip according to teachings of the present invention.

FIG. 7 illustrates a chip and testing facility according to the teachings of the present invention. The chip 700 includes substrate 702 on which internal logic circuit 704 is fabricated. Testing facility comprising of boundary scan cells 706 are fabricated on the substrate and between I/O pads labeled Scan In, Scan Out and Test I/O. The Scan In I/O pad is coupled through a receiver R to the boundary test facility. Likewise, the Scan Out pad is connected through a driver D to the boundary scan testing facility. Functional driver receiver circuits 708 interconnect internal logic circuit 704 to test I/O pad. The arrows in to boundary scan cells 706 indicate the LSSD clock structure which is necessary for this system to work. A plurality of I/O pads are shown on the left side of the chip with the names of the signal that is received on the respective pads written thereon. In the system shown the clock, Scan In and Scan Out signals have to be kept on separate device pins. The functional driver/receiver and test mode signals could be combined on a single device pin 710 and 712, respectively.

It should be understood that the above described arrangements are merely illustrative of the application of principles of the invention and that other arrangements may be devised by workers skilled in the art without departing from the spirit and scope of the invention.

What is claimed is:
1. A boundary scan device comprising:
a (Level Sensitive Scan Design) LSSD circuit;
an LSSD clock stricture operatively coupled to said LSSD circuit; and
a switch driver circuit operatively coupled to an output of said LSSD circuit, wherein the switch driver circuit includes: a latch; a first gate for gating information into said latch operatively connected to an input of said latch; a second gate for gating information from said latch operatively connected to said latch;

wherein the switch driver circuit includes:
a first gate (606) having a first electrode to provide an output signal;
a first latch (604) having an output operatively connected to a second electrode of said first Rate and an input operatively connected to a third electrode of said first gate;
a second latch having an output operatively connected to a third electrode of said first gate;
a second gate (610) having an electrode operatively connected to the first latch and the second latch; and
a third gate (608) having an electrode operatively connected to an input of the second latch.

2. The boundary scan device of claim 1 wherein the LSSD circuit includes an L1 latch connected in series to an L2 latch.

3. The boundary scan device of claim 2 wherein the L1 latch comprises: a first inverter with input port and output port; a second inverter with an input connected to the output port and an output; a first N channel FET operatively connected to the input port, a second N channel FET operatively connected to the input port; and a feedback conductor interconnecting the output to the input port.

4. The boundary scan device of claim 3 wherein the L2 latch comprises: an L3 latch having an L3 output and L3 input; a third N channel FET device operatively connecting the output port to the L3 input; an L4 latch having a L4 input connected to the L3 output and an L4 output connected to the L4 input.

5. The device of claim 4 wherein the LSSD clock structure includes an A clock connected to the gate of the second FET device; a C clock operatively connected to the gate of the first FET device; and a B clock operatively connected to the gate of the third N channel FET device.

6. The device of claim 1 wherein the LSSD clock structure includes an A clock, a B clock and a C clock.

7. The device of claim 1 wherein the first gate includes an N channel FET device.

8. The device of claim 7 wherein to second gate includes a P channel FET device.

9. The device of claim 8 wherein the latch includes a first inverter and a second inverter connected in series with the output of the second inverter connected to the input of the first inverter.

10. The device of claim 1 wherein the first gate includes a P channel FET device.

11. The device of claim 1 wherein the second gate and the third gate includes N channel FET device.

12. The device of claim 1 further including a VLSI chip having at least one pair of I/O pads wherein the LSSD circuit and the switch driver circuit are connected between the at least one pair of I/O pads.

13. The device of claim 12 further including at least one functional driver/receiver circuit connected in series with one of the at least one pair of I/O pads.

14. A chip comprising:
a substrate;
internal circuits operatively fabricated on said substrate;
n driver/receiver circuits operatively coupled to the internal circuits;
m I/O pads, wherein each of the m I/O pads is operatively connected to one driver/receiver circuit; and
a boundary scan circuit arrangement operatively connected to said chip in such a way that the signal transmission path for said boundary scan circuit arrangement is separate from the signal path used by the chip during normal operation, wherein the boundary scan circuit arrangement includes at least one LSSD L1/L2 latch and switch driver operatively wired between at least one pair of I/O pads and wherein:
the L1 latch comprises: a first inverter with input port and output port; a second inverter with an input connected to the output port and an output; a first N channel FET operatively connected to the input port; a second N channel FET operatively connected to the input port; and a feedback conductor interconnecting the output to the input port;
the L2 latch comprises: an L3 latch having an L3 output and L3 input; a third N channel FET device operatively connecting the output port to the L3 input; an L4 latch having a L4 input connected to the L3 output and an L4 output connected to the L4 input; and
an LSSD clock structure includes an A clock connected to the gate of the second FET device; a C clock operatively connected to the gate of the first FET device; and a B clock operatively connected to the gate of the third N channel FET device.

15. A device comprising:
a VLSI chin having at least first and second I/O pads;
a boundary scan test facility operatively connected between the at least first and second I/O pads, wherein said boundary scan test facility includes a LSSD structure and a switch driver connected to said LSSD structure;
a first driver/receiver circuit connected in series with the at least first I/O pad; and a second driver/receiver circuit connected in series with the at least second I/O pad;
wherein further the LSSD structure comprises:
at least one LSSD L1/L2 latch and switch driver operatively wired between the at least first and second I/O pads, wherein:
the L1 latch comprises: a first inverter with input port and output port; a second inverter with an input connected to the output port and an output; a first N channel FET operatively connected to the input port; a second N channel FET operatively connected to the input port; and a feedback conductor interconnecting the output to the input port;
the L2 latch comprises: an L3 latch having an L3 output and L3 input; a third N channel FET device operatively connecting the output port to the L3 input; an L4 latch having a L4 input connected to the L3 output and an L4 output connected to the L4 input; and
an LSSD clock structure includes an A clock connected to the gate of the second FET device; a C clock operatively connected to the gate of the first FET device; and a B clock operatively connected to the gate of the third N channel FET device.

16. The device of claim 15 wherein the first and second I/O pads are test I/O pads.

17. A method comprising:
providing VLSI chip having at least a first I/O pad and a second I/O pad;
providing a boundary scan testing circuit arrangement that includes a LSSD structure and a switch driver connected to said LSSD structure; a first driver/receiver circuit connected in series with the at least first I/O pad; and a second driver/receiver circuit connected in series with the at least second I/O pad; and
wiring said boundary scan testing circuit arrangement between the first I/O pad and second I/O pad wherein testing routines can be executed without using I/O driver/receiver circuits used during normal operation of said VLSI chip;
   wherein further the LSSD structure of said providing step comprises:
      at least one LSSD L1/L2 latch and switch driver operatively wired between the at least first and second I/O pads, wherein:
      the L1 latch comprises: a first inverter with input port and output port; a second inverter with an input connected to the output port and an output; a first N channel FET operatively connected to the input port; a second N channel FET operatively connected to the input port; and a feedback conductor interconnecting the output to the input port;

the L2 latch comprises: an L3 latch having an L3 output and L3 input a third N channel FET device operatively connecting the output port to the L3 input; an L4 latch having a L4 input connected to the L3 output and an L4 output connected to the L4 input; and an LSSD clock structure includes an A clock connected to the gate of the second FET device; a C clock operatively connected to the gate of the first FET device; and a B clock operatively connected to the gate of the third N channel FET device.

* * * * *

UNITED STATES PATENT AND TRADEMARK OFFICE
CERTIFICATE OF CORRECTION

| | | |
|---|---|---|
| PATENT NO. | : 7,032,146 B2 | Page 1 of 1 |
| APPLICATION NO. | : 10/282825 | |
| DATED | : April 18, 2006 | |
| INVENTOR(S) | : Robert Lee Ayers, Sr. | |

It is certified that error appears in the above-identified patent and that said Letters Patent is hereby corrected as shown below:

At column 4, line 59, delete "stricture" and insert --structure--.

In Claim 17, at column 8, line 2, between "input" and "a" insert --;--.

Signed and Sealed this

Fourteenth Day of November, 2006

JON W. DUDAS
*Director of the United States Patent and Trademark Office*